United States Patent
Lee et al.

(10) Patent No.: US 9,129,988 B1
(45) Date of Patent: Sep. 8, 2015

(54) FINFET AND METHOD OF MANUFACTURING THE SAME

(71) Applicant: TAIWAN SEMICONDUCTOR MANUFACTURING CO., LTD., Hsinchu (TW)

(72) Inventors: Wei-Yang Lee, Taipei (TW); Ting-Yeh Chen, Hsinchu (TW); Chia-Ling Chan, New Taipei (TW); Chien-Tai Chan, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 14/555,439

(22) Filed: Nov. 26, 2014

(51) Int. Cl.
*H01L 21/00* (2006.01)
*H01L 29/66* (2006.01)

(52) U.S. Cl.
CPC ..... *H01L 29/66545* (2013.01); *H01L 29/66795* (2013.01)

(58) Field of Classification Search
CPC ............... H01L 27/0886; H01L 29/66545; H01L 29/785; H01L 29/66795
USPC .................. 438/149–164, 478–480
See application file for complete search history.

(56) References Cited

U.S. PATENT DOCUMENTS

| | | | |
|---|---|---|---|
| 8,703,556 B2 * | 4/2014 | Kelly et al. | 438/157 |
| 8,871,583 B2 * | 10/2014 | Fumitake | 438/195 |
| 8,946,027 B2 * | 2/2015 | Anderson et al. | 438/282 |
| 8,975,167 B2 * | 3/2015 | Hong | 438/478 |
| 8,993,445 B2 * | 3/2015 | Choi et al. | 438/696 |

* cited by examiner

*Primary Examiner* — Cuong Q Nguyen
(74) *Attorney, Agent, or Firm* — Maschoff Brennan (57) ABSTRACT

A FinFET includes a fin structure, a gate and a source-drain region. The fin structure is over a substrate and has a recess of an upper surface of the fin structure and a doped region in the fin structure and adjacent to the recess. The gate protrudes from the recess and across over the fin structure. The source-drain region is in the fin structure and adjacent to the doped region. Methods for forming the FinFET are also provided.

20 Claims, 10 Drawing Sheets

FINFET AND METHOD OF MANUFACTURING THE SAME

BACKGROUND

The semiconductor integrated circuit (IC) industry has experienced rapid growth. Over the course of the growth, functional density of the semiconductor devices has increased with decrease of device feature size or geometry. The scaling down process generally provides benefits by increasing production efficiency, reducing costs, and/or improving device performance. However, such scaling down has also increased complexity of the IC manufacturing processes.

With the demands on shrinking geometry of ICs, a three dimensional transistor, such as a fin-like field-effect transistor (FinFET), has been introduced to replace a planar transistor. However, device performance of such FinFET is still not satisfactory in advanced applications of technology. Therefore, improvements in structures and methods of forming a FinFET with better device performance continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, device performance of a conventional FinFET is still not satisfactory in advanced applications of technology. Therefore, the present disclosure provides a FinFET includes a fin structure having a doped region acted as a lightly drain doped (LDD) region, which is formed using a plasma doping (PLAD) process and an annealing process or formed through the fin structure. Such doped region can let the FinFET exhibit high Ion-Ioff. In accordance with experimental results, the FinFET of the present disclosure indeed exhibit higher Ion-Ioff than that of a conventional FinFET having a LDD region formed using ion implantation, which is not through the fin structure.

In addition, an upper surface of the fin structure of the FinFET of the present disclosure has a recess, which is configured to accommodate a gate included in the FinFET, and thus current crowding effect due to a cleaning process after the PLAD process and the annealing process will not occur, and those will be described in detail below.

Figure 1A:
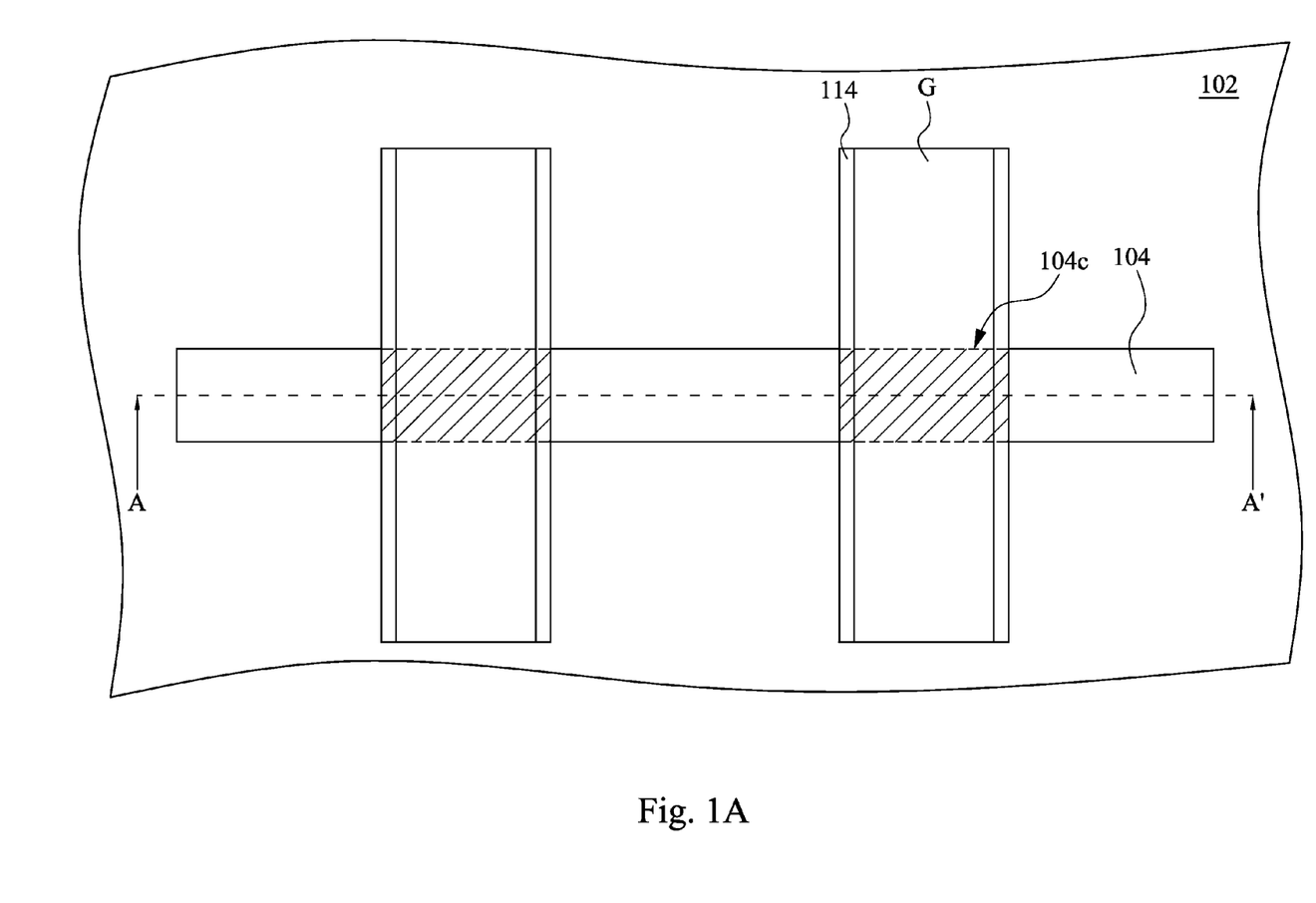
FIG. 1A is a simplified top view of a FinFET in accordance with some embodiments of the present disclosure.
Figure 1B:
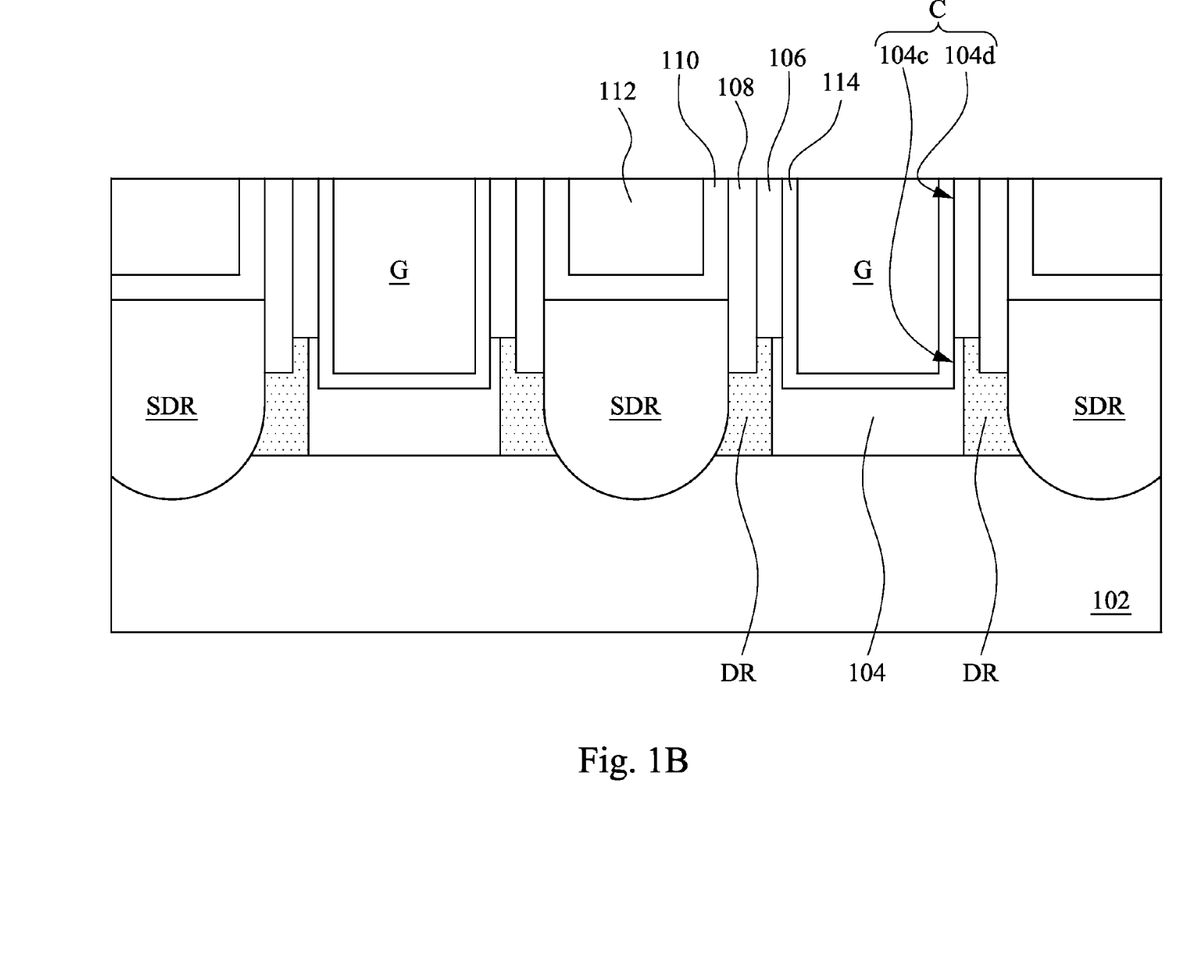
FIG. 1B is a cross-sectional view of the FinFET taken along a section line AA' of FIG. 1A.

FIG. 1A is a simplified top view of a FinFET in accordance with some embodiments of the present disclosure. FIG. 1B is a cross-sectional view of the FinFET taken along a section line AA' of FIG. 1A. As shown in FIGS. 1A and 1B, the FinFET includes a fin structure 104, a gate G and a source-drain region SDR. In various embodiments, the FinFET further includes a dielectric layer 114, a first spacer 106, a second spacer 108, a contact etch stop layer (CESL) 110, an inter-layer dielectric (ILD) layer 112 or a combination thereof.

The fin structure 104 is over a substrate 102. The term "substrate" as used herein refers to a material layer that serves as a basis. One should note that some of the structures have been omitted for the purpose of simplicity and clarity. In some embodiments, the substrate 102 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the substrate 102 is a bulk silicon substrate. In some embodiments, the substrate 102 and the fin structure 104 are made of a same material. In some embodiments, the substrate 102 and the fin structure 104 are integrally formed; that is, there is no boundary between the substrate 102 and the fin structure 104.

In some embodiments, the substrate 102 further includes isolation structures (not shown) adjacent to the fin structure 104, such as shallow trench isolation (STI) structures. The isolation structure is configured to separate the fin structure 104 from another fin structure (not shown) adjacent to the fin structure 104. In some embodiments, the isolation structures are made of a dielectric material, such as silicon oxide, silicon nitride, silicon oxynitride, fluoride-doped silicate glass, a low-k dielectric material, any other suitable dielectric material or a combination thereof.

The fin structure 104 has a doped region DR in the fin structure 104, as shown in FIG. 1B. The doped region DR can be acted as a LDD region. In some embodiments, the doped region DR has a dopant concentration in a range of about $10^{15}$ ions/cm$^3$ to about $10^{17}$ ions/cm$^3$. In some embodiments, for the n-type FinFET, the doped region DR includes n-type dopants, such as phosphorus, arsenic, antimony, bismuth, selenium, or tellurium, any other suitable n-type dopant or a combination thereof. In some embodiments, for the p-type FinFET, the doped region DR includes p-type dopants, such as boron, boron difluoride, any other suitable p-type dopant or a combination thereof.

It is noteworthy that the doped region DR extends to approach the substrate 102. As shown in FIG. 1B, in some embodiments, the doped region DR is through the fin structure 104, and thus able to exhibit better Ion-Ioff compared to a conventional FinFET having a LDD region, which is not through a fin structure.

In addition, in some embodiments, the doped region DR is formed using a PLAD process and an annealing process so as to have a conformal doping profile in the fin structure; that is, the doping profile does not decay with depth. The doping profile can be tested by secondary ion mass spectroscopy (SIMS). Nevertheless, a LDD region formed using ion implantation exhibits a non-conformal doping profile in the fin structure; that is, the doping profile decays with depth, which is not conducive to Ion-Ioff. Therefore, the doped region DR formed using the PLAD process and the annealing process can let the FinFET of the present disclosure exhibit better Ion-Ioff than that of the conventional FinFET having the LDD region formed using ion implantation.

The fin structure 104 has a recess 104c of an upper surface of the fin structure 104, as shown in FIGS. 1A and 1B. The doped region DR is adjacent to the recess 104c. The recess 104c is configured to accommodate the gate G. Specifically, the recess 104c is configured to accommodate a bottom of the gate G. In some embodiments, the recess 104c has a width greater than that of the gate G. In some embodiments, the recess 104c has a depth in a range of about 1 nm to about 5 nm. In some embodiments, the recess 104c is a straight-walled recess or an angled recess. In the embodiment of FIG. 1B, the recess 104c is a straight-walled recess.

The gate G protrudes from the recess 104c and across over the fin structure 104, as shown in FIGS. 1A and 1B. The bottom of the gate G is accommodated in the recess 104c. In some embodiments, the gate G includes metal. In some embodiments, the gate G includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof.

The source-drain region SDR is in the fin structure 104 and adjacent to the doped region DR. The doped region DR is between the gate G and the source-drain region SDR. In some embodiments, the source-drain region SDR is in contact with the doped region DR. In some embodiments, the source-drain region SDR is through the fin structure 104 and in contact with the substrate 102. In some embodiments, the source-drain region SDR has an upper surface higher than an upper surface of the fin structure 104. In some embodiments, the source-drain region SDR is an epitaxial structure.

In some embodiments, the FinFET further includes the dielectric layer 114 between the recess 104c and the gate G, as shown in FIGS. 1B and 1A. In some embodiments, the dielectric layer 114 is a high-k dielectric layer, which may include $HfO_2$, $ZrO_2$, $Y_2O_3$, $La_2O_5$, $Gd_2O_5$, $TiO_2$, $Ta_2O_5$, HfSiO, HfSiON, HfErO, HfLaO, HfYO, HfGdO, HfAlO, HfZrO, HfTiO, HfTaO, SrTiO, any other suitable high-k dielectric material or a combination thereof.

In some embodiments, the FinFET further includes the first spacer 106 over sidewalls of the gate G. The first spacer 106 is configured to isolate the gate G from the source-drain region SDR. In some embodiments, the first spacer 106 is over a portion of the doped region DR. In some embodiments, the first spacer 106 is made of silicon oxide, silicon nitride, silicon oxynitride, silicon carbon nitride, any other suitable material or a combination thereof. In some embodiments, the first spacer 106 has a thickness in a range of about 3 nm to about 5 nm. In some embodiments, the first spacer 106 has a bottom surface the same height as the upper surface of the fin structure 104, and a bottom surface of the recess 104c is lower than the bottom surface of the first spacer 106.

In some embodiments, the FinFET further includes the second spacer 108 adjacent to the first spacer 106 and over the doped region DR. The second spacer 108 is configured to isolate the gate G from the source-drain region SDR. In some embodiments, the second spacer 108 has a thickness in a range of about 3 nm to about 5 nm. In some embodiments, the second spacer 108 has a bottom surface lower than a bottom surface of the first spacer 106. In some embodiments, the bottom surface of the second spacer 108 is lower than the bottom surface of the first spacer 106 due to a cleaning process after the PLAD process and the annealing process. However, the lower bottom surface of the second spacer 108 may result in current crowding effect occurring near the second spacer 108; in other words, current will be blocked near the second spacer 108. Accordingly, in some embodiments, the bottom surface of the recess 104c is lower than or the same height as the bottom surface of the second spacer 108 to avoid current crowding effect occurring near the second spacer 108.

In some embodiments, the FinFET further includes the CESL 110 over the source-drain region SDR. In some embodiments, the CESL 110 is formed of silicon nitride, silicon oxynitride, silicon carbon nitride, any other suitable insulating material or a combination thereof.

In some embodiments, the FinFET further includes the ILD layer 112 over the CESL 110. In some embodiments, the ILD layer 112 is formed of silicon oxide, silicon oxynitride, any other suitable insulating material or a combination thereof.

FIGS. 2A-2H are cross-sectional views at various stages of manufacturing a FinFET in accordance with some embodiments of the present disclosure. FIGS. 2A-2H are cross-sectional views taken along an axis of a fin structure of the FinFET.

Figure 2A:
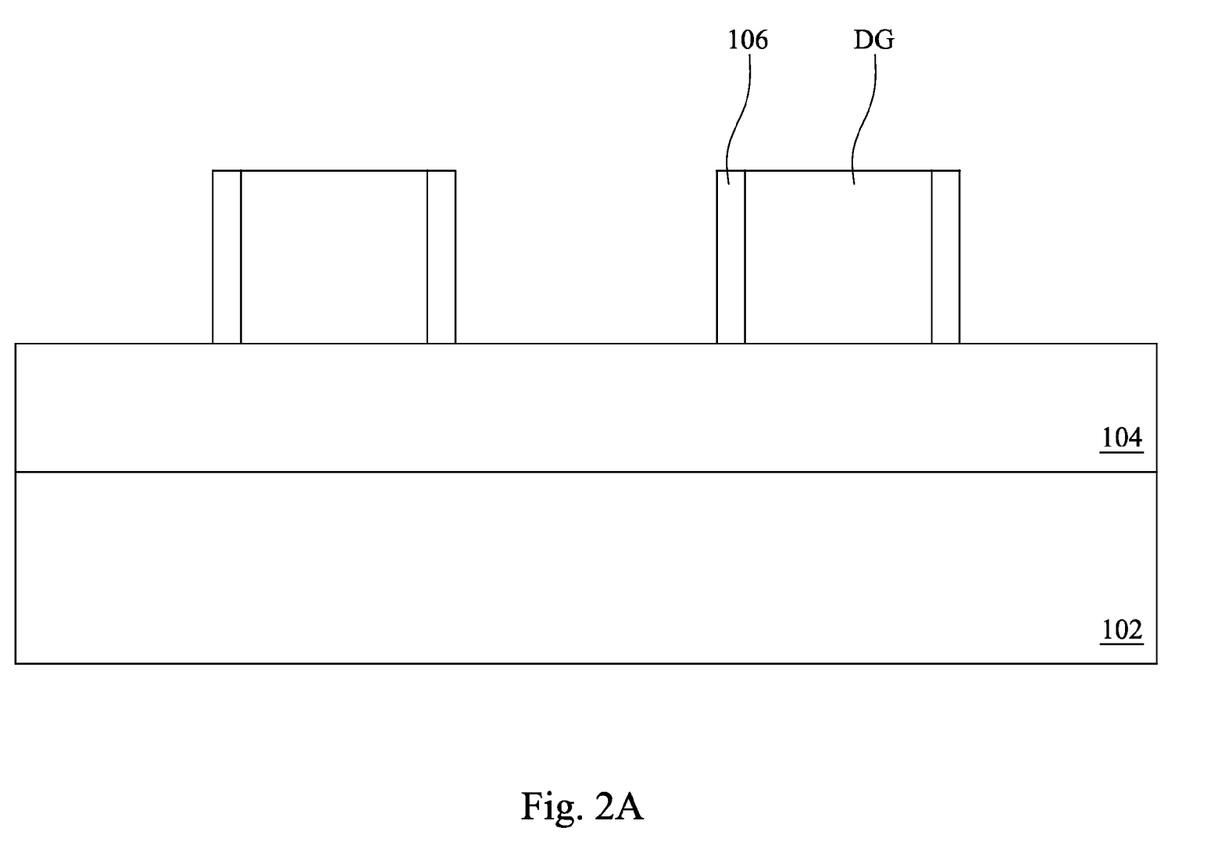
FIGS. 2A-2H are cross-sectional views at various stages of manufacturing a FinFET in accordance with some embodiments of the present disclosure.

Referring to FIG. 2A, a fin structure 104 is formed over the substrate 102. In some embodiments, the substrate 102 and the fin structure 104 are formed by selectively etching a thick substrate (not shown). Specifically, in the embodiments, the thick substrate is firstly provided, and portions of the thick substrate are removed to define the fin structure 104 protruding from the substrate 102. However, other techniques for fabricating the fin structure 104 are possible.

In some embodiments, the thick substrate includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the thick substrate is a bulk silicon substrate.

In some embodiments, the portions of the thick substrate are removed by photolithography and etching process to form trenches (not shown), and thus to define the fin structure 104.

In some embodiments, the photolithography process includes forming a photoresist layer (resist) overlying the thick substrate, exposing the resist to a pattern, performing a post-exposure bake process, and developing the resist to form a masking element. In some embodiments, the etching process with the masking element includes reactive ion etch (RIE), any other suitable process or a combination thereof.

In some embodiments, isolation structures (not shown) are formed in the trenches after definition of the fin structure 104. In some embodiments, the isolation structures are formed by filling a dielectric material in the trenches and then performing a planarization process, such as a chemical mechanical polish (CMP) process, a grinding process, an etching process, any other suitable material removal process or a combination thereof. In some embodiments, the dielectric material includes silicon oxide, silicon nitride, silicon oxynitride, fluoride-doped silicate glass, a low-k dielectric material, any other suitable dielectric material or a combination thereof.

A dummy gate DG is then formed across over the fin structure 104, as shown in FIG. 2A. The dummy gate DG covers a channel region (not marked) of the fin structure 104. The dummy gate DG will be removed later to form a cavity, and a conductive material will then be formed in the cavity to form a real gate. In some embodiments, the dummy gate DG is made of polysilicon, amorphous silicon, any other suitable material or a combination thereof. In some embodiments, the dummy gate DG is fabricated by deposition, such as chemical vapor deposition (CVD) or physical vapor deposition (PVD).

A first spacer 106 is formed over sidewalls of the dummy gate DG after forming the dummy gate DG, as shown in FIG. 2A. In some embodiments, a dielectric material (not shown) is deposited and then etched to form the first spacer 106 on two opposite sidewalls of the dummy gate DG. In some embodiments, the first spacer 106 is made of silicon oxide, silicon nitride, silicon oxynitride, silicon carbon nitride, any other suitable dielectric material or a combination thereof. In some embodiments, the first spacer 106 has a thickness in a range of about 3 nm to about 5 nm.

Figure 2B:
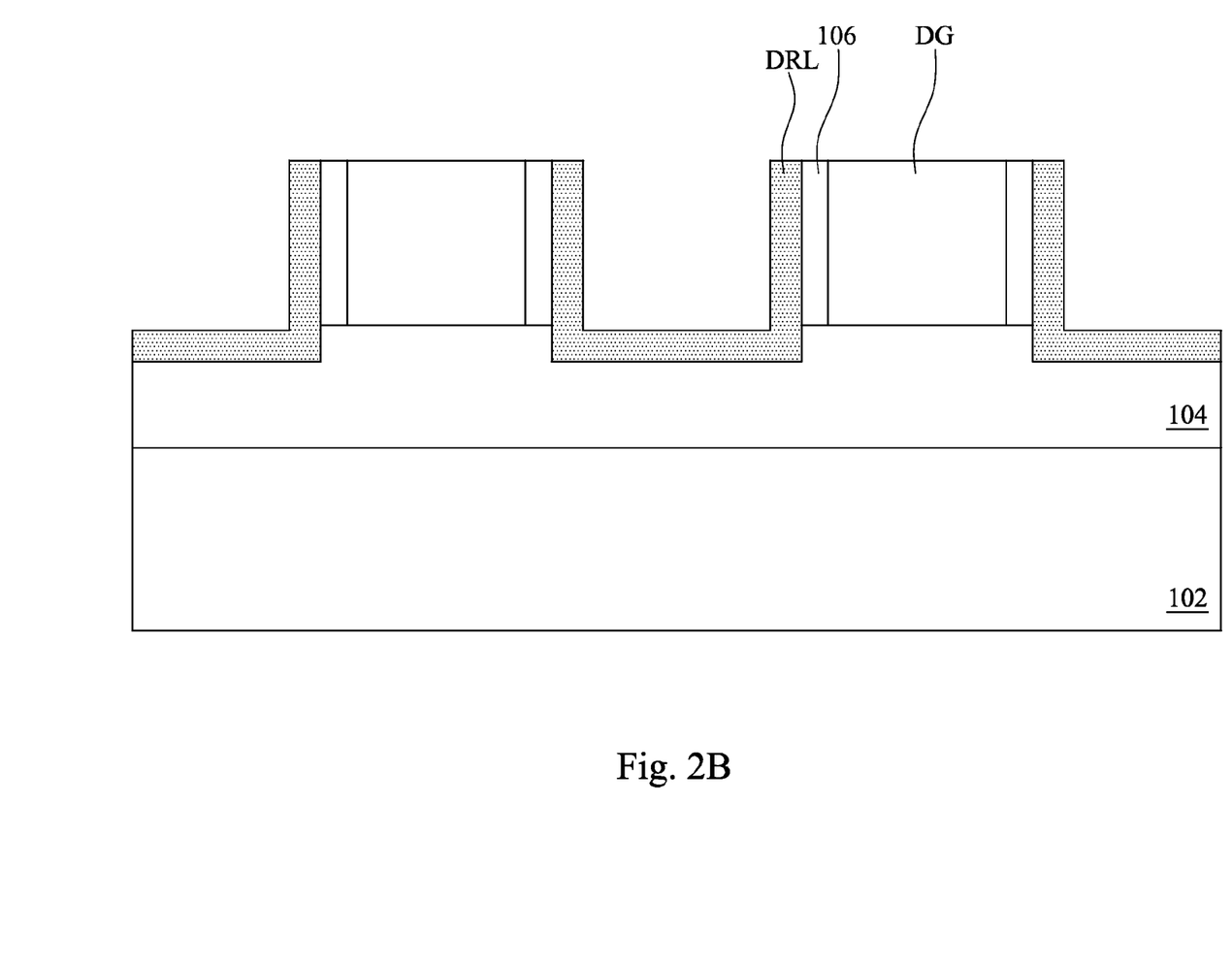

Referring to FIG. 2B, a PLAD process is performed to form a dopant-rich layer DRL in the fin structure 104 and over sidewalls of the first spacer 106. In some embodiments, for the n-type FinFET, the dopant-rich layer DRL includes n-type dopants, such as phosphorus, arsenic, antimony, bismuth, selenium, tellurium, any other suitable n-type dopant or a combination thereof. In some embodiments, for the p-type FinFET, the dopant-rich layer DRL includes p-type dopants, such as boron, boron difluoride, any other suitable p-type dopant or a combination thereof. In some embodiments, the PLAD process has a dosage in a range of about $10^{15}$ ions/cm$^3$ to about $10^{17}$ ions/cm$^3$.

In some embodiments, the PLAD process is performed in an apparatus (not shown) including a chamber and power sources. In some embodiments, one of the power sources is a radio frequency (RF) power source with a programmable pulse modulation function, and the other of the power sources is a pulsed direct current (DC) or RF power source for providing a bias voltage on the substrate 102. In some embodiments, the bias voltage is in a range of 0.2 kV to 10 kV. In some embodiments, the power sources are independently operated. Each of the power sources can be programmed to be independently powered on and off without affecting the other. Plasma is generated from a process gas in the chamber. The process gas may include at least one dopant gas such as $AsH_3$, $B_2H_6$, $PH_3$, $BF_3$, any other dopant gas or a combination thereof, and at least one dilution gas such as Xe, Ar, He, Ne, $H_2$, $O_2$, $N_2$, any other suitable dilution gas or a combination thereof.

Figure 2C:
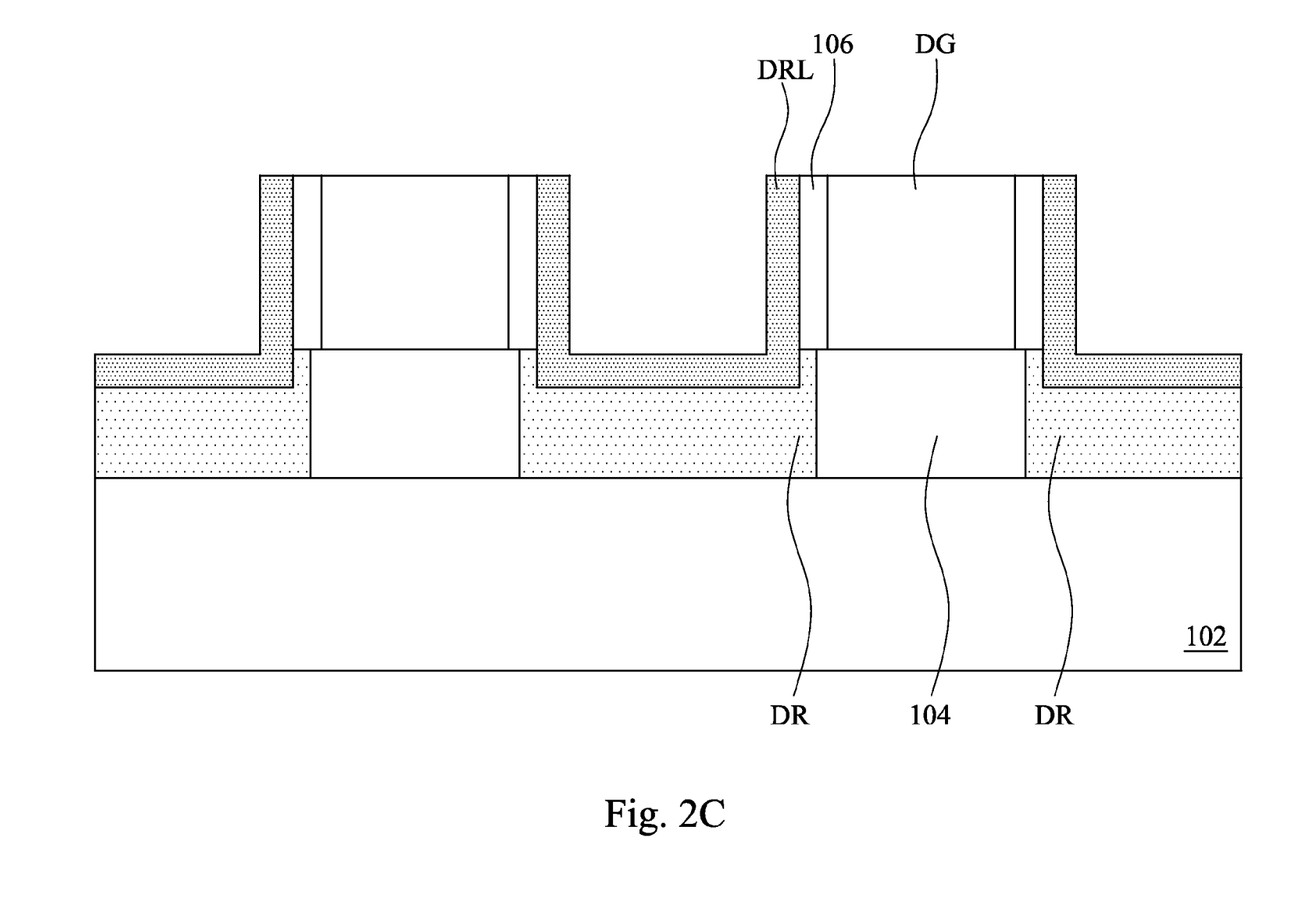

Referring to FIG. 2C, the dopant-rich layer DRL is annealed to form the doped region DR in the fin structure 104. The annealing process can drive dopants from the dopant-rich layer DRL into the fin structure 104 so as to form the doped region DR. In some embodiments, the annealing process includes a spike annealing process. In some embodiments, the dopant-rich layer DRL is annealed with an oxygen-containing chemical. In some embodiments, the oxygen-containing chemical includes oxygen, ozone, dihydrogen oxide, hydrogen peroxide, other oxygen-containing chemical or a combination thereof. The oxygen-containing chemical may be in a vapor phase, a gaseous phase, a plasma phase, other phase or a combination thereof. Temperature and duration of the annealing process may be adjusted to let the doped region DR have a desired depth.

Figure 2D:
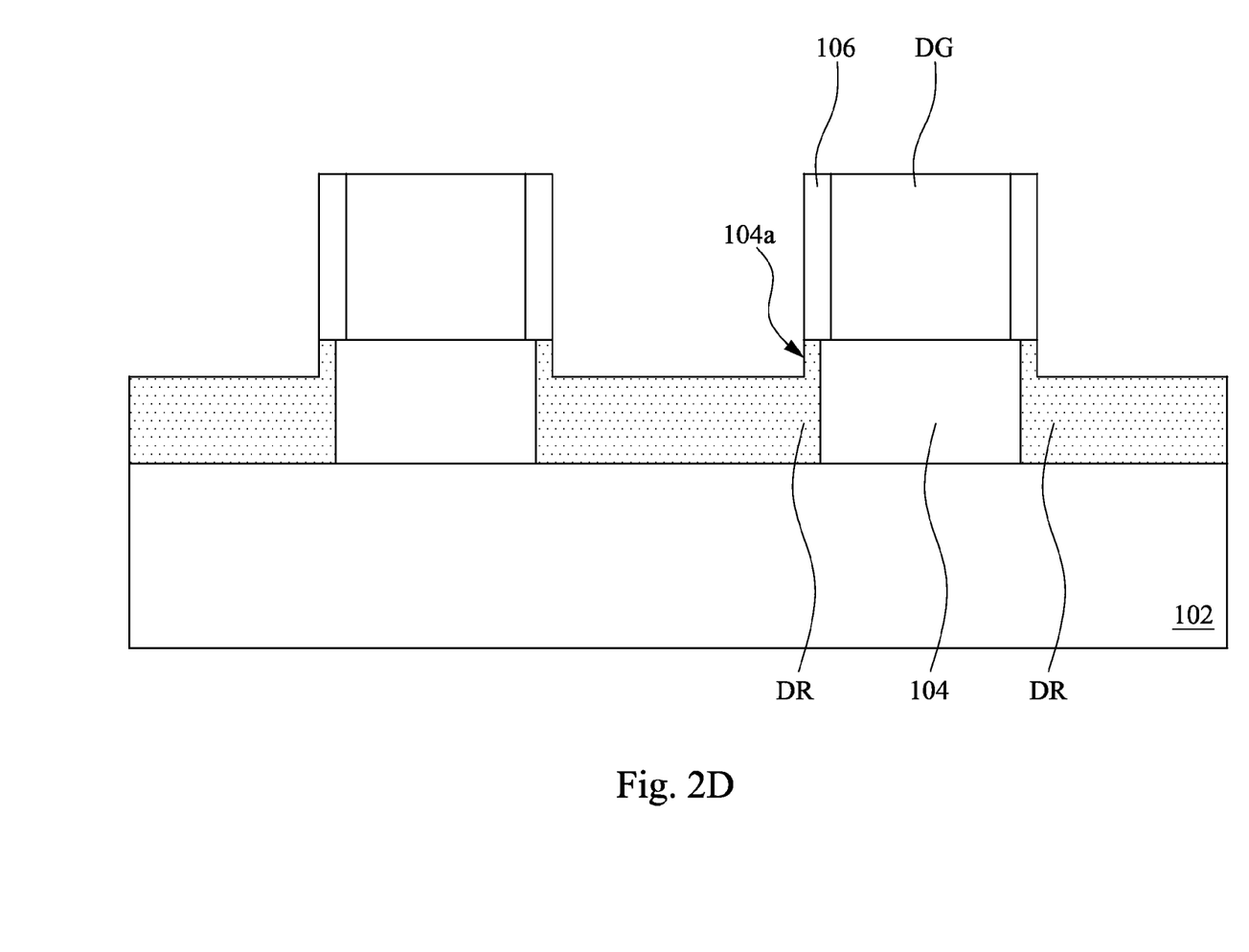

Referring to FIG. 2D, the dopant-rich layer DRL is removed, and thus a recess 104a is formed. In some embodiments, the dopant-rich layer DRL is removed using a cleaning process. In some embodiments, the cleaning process includes an etching process, such as a dry or wet etching process. In some embodiments, sulfuric acid solution is utilized in the wet etching process.

Figure 2E:
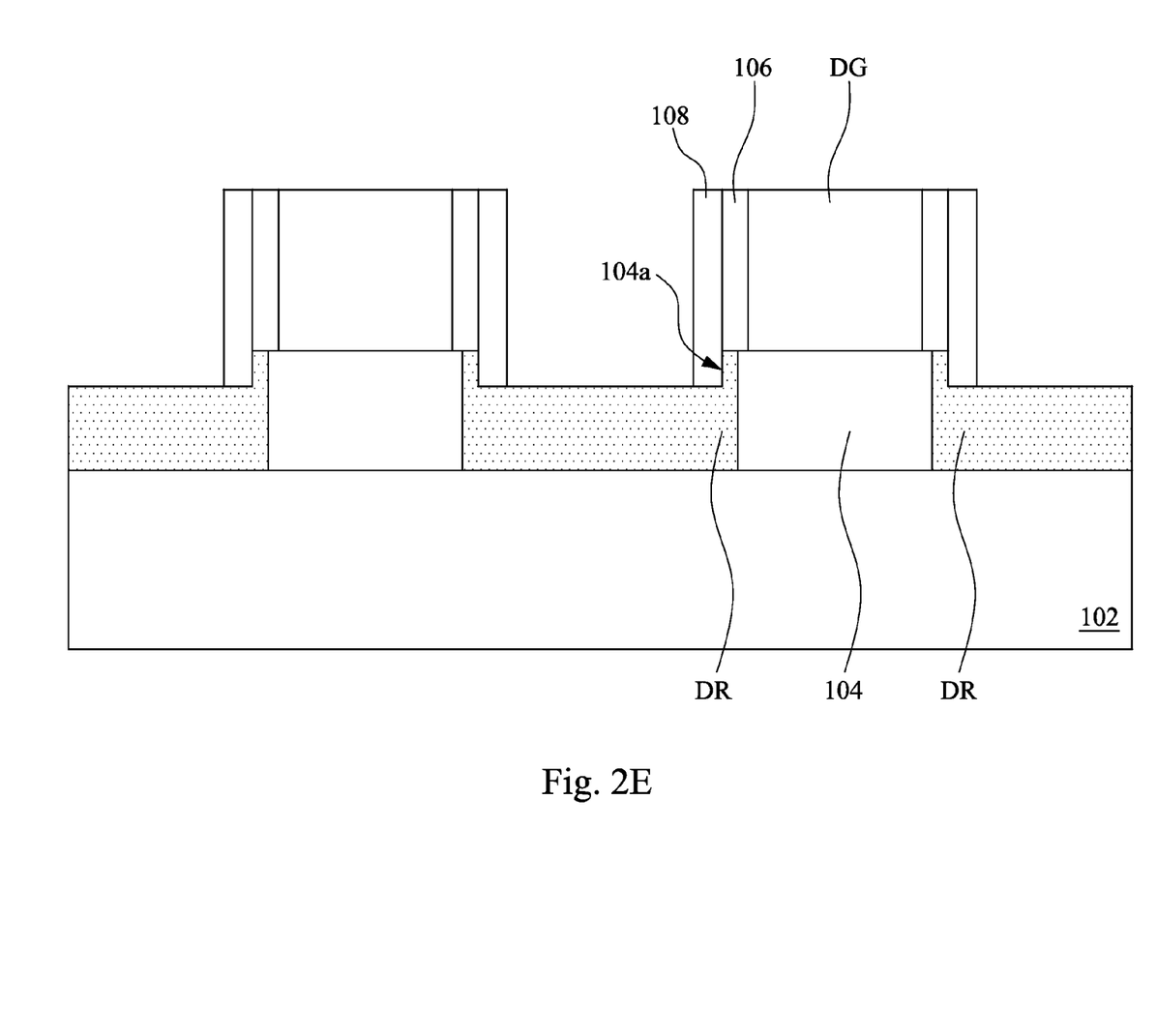

Referring to FIG. 2E, a second spacer 108 is formed adjacent to the first spacer 106 and over the doped region DR after removing the dopant-rich layer DRL. Specifically, the second spacer 108 is formed adjacent to the first spacer 106 and protruding from the recess 104a. In some embodiments, a dielectric material (not shown) is deposited and then etched to form the second spacer 108 over sidewalls of the first spacer 106. In some embodiments, the second spacer 108 is made of silicon oxide, silicon nitride, silicon oxynitride, silicon carbon nitride, other dielectric suitable material or a combination thereof. In some embodiments, the second spacer 108 has a thickness in a range of about 3 nm to about 5 nm.

Figure 2F:
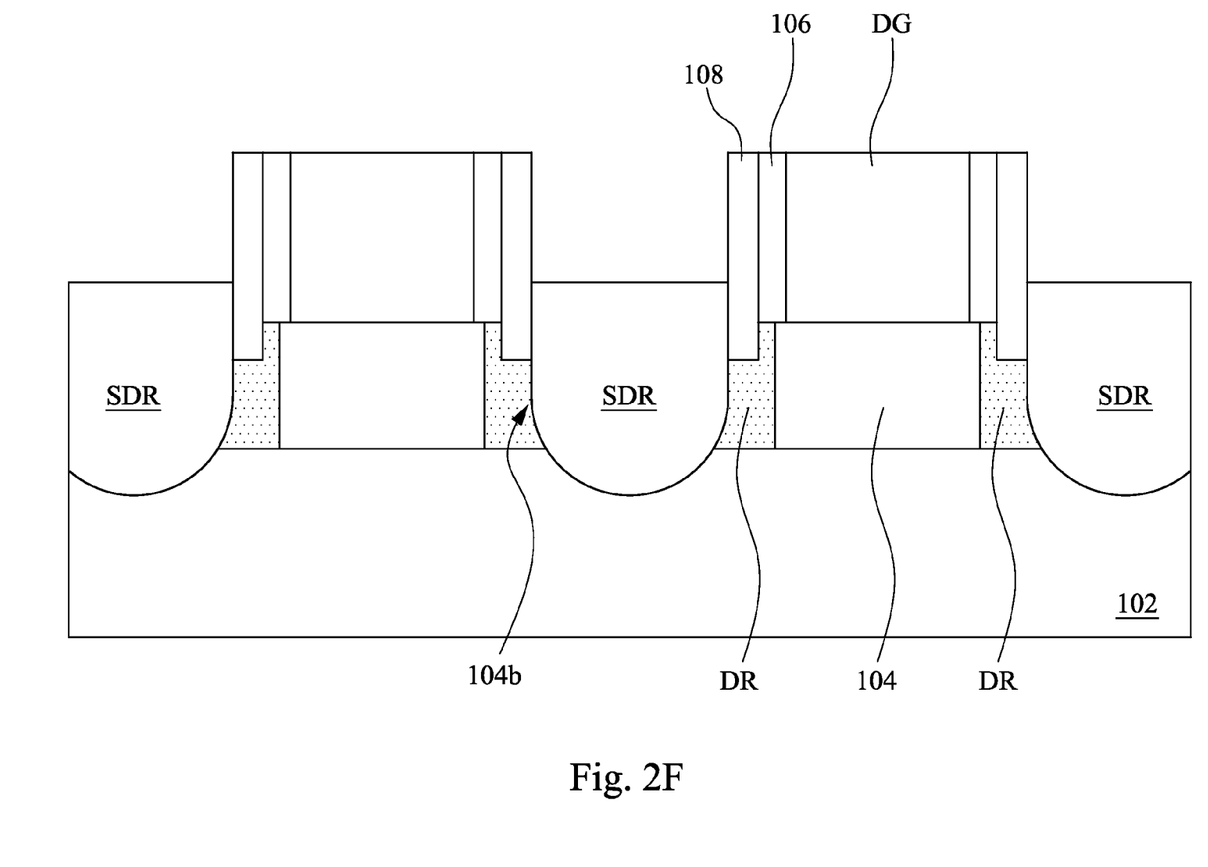

Referring to FIGS. 2E and 2F, a source-drain region SDR is formed in the doped region DR. Specifically, after the second spacer 108 is formed, a portion of the doped region DR is removed to form a recess 104b shown in FIG. 2F, and the source-drain region SDR is then formed in the recess 104b. In some embodiments, the doped region DR is removed using photolithography and etching processes, such as including forming a photoresist layer, patterning the photoresist layer to expose the doped region DR and etching the doped region DR according to the photoresist layer. In some embodiments, the source-drain region SDR is epitaxially (epi) grown in the recess 104b. In some embodiments, the source-drain region SDR is epitaxially grown protruding from the recess 104b, and thus the source-drain region SDR has an upper surface higher than an upper surface of the fin structure 104.

Figure 2G:
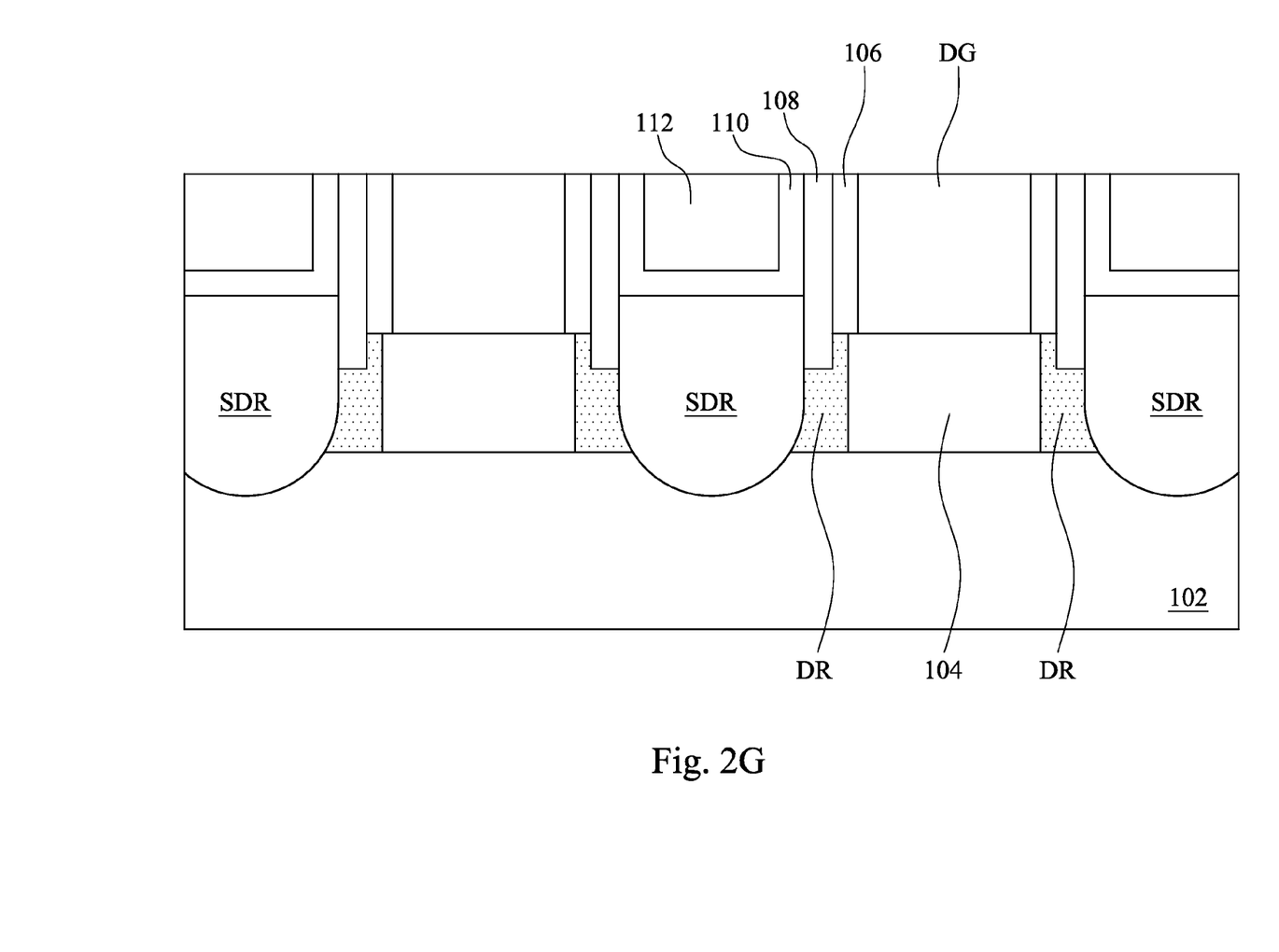

Referring to FIG. 2G, after the source-drain region SDR is formed, a CESL 110 is formed over the source-drain region SDR, and an ILD layer 112 is then formed over the CESL 110. In some embodiments, the CESL 110 is formed using sputtering, PVD, CVD, MOCVD (metal organic chemical vapor deposition) or MBE (molecular beam epitaxy). However, other methods for fabricating the CESL 110 may alternatively be used. In some embodiments, the CESL 110 is made of silicon nitride, silicon oxynitride, silicon carbon nitride, any other suitable insulating material or a combination thereof. In some embodiments, the ILD layer 112 is formed using sputtering, PVD, CVD, MOCVD, MBE, other methods known and used in the art for forming the ILD layer 112 or a combination thereof. In some embodiments, the ILD layer 112 is made of silicon oxide, silicon oxynitride, any other suitable insulating material or a combination thereof.

Figure 2H:
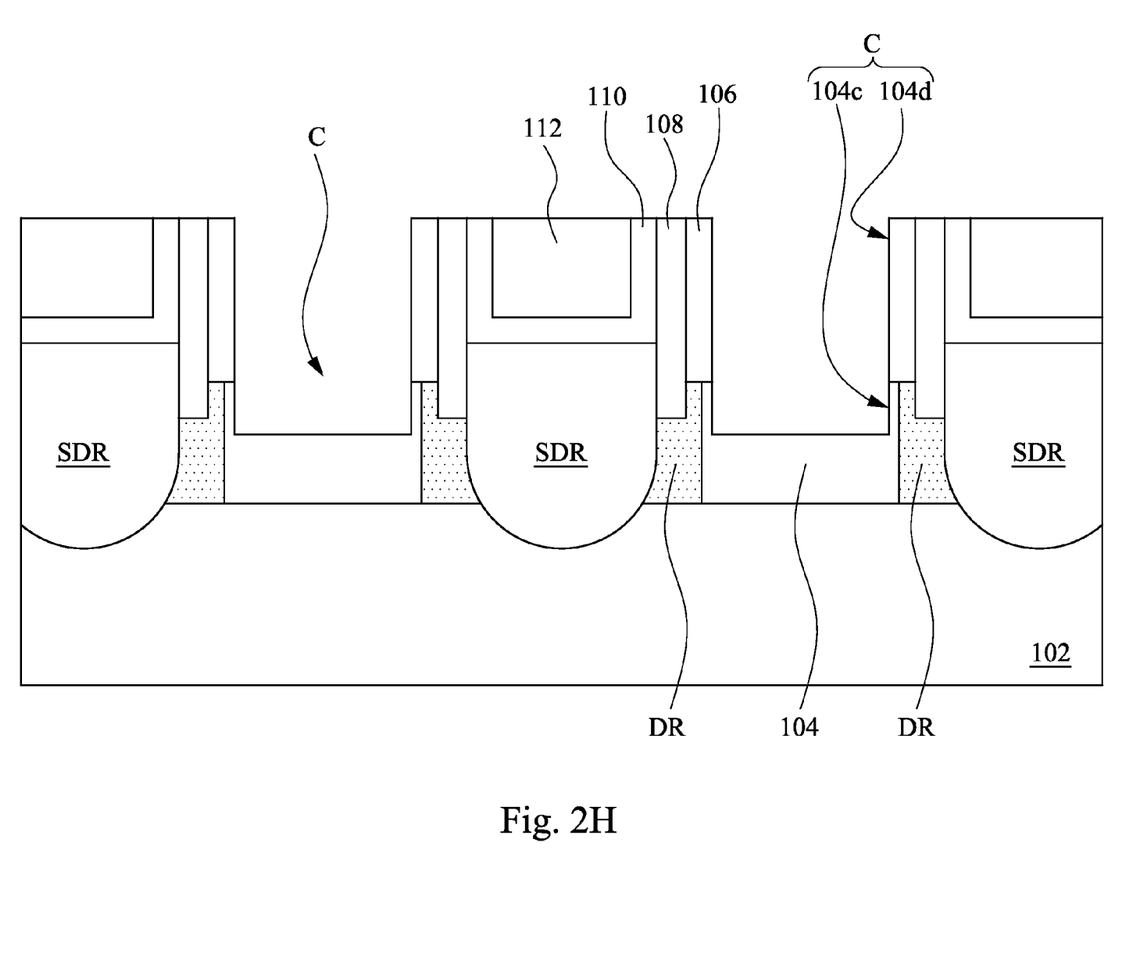

Referring to FIG. 2H, the dummy gate DG and a portion of the fin structure 104 beneath the dummy gate DG are removed to form a cavity C. The cavity C includes a recess 104c of the upper surface of the fin structure 104 and a recess 104d confined by the first spacer 106. The recess 104d is aligned with the recess 104c. In some embodiments, the portion of the fin structure 104 beneath the dummy gate DG has a thickness of about 1 nm to about 5 nm. In other words, the recess 104c has a depth in a range of about 1 nm to about 5 nm. In some embodiments, the dummy gate DG and the portion of the fin structure 104 beneath the dummy gate DG are removed using an etching process, such as dry, wet etching process or a combination thereof. In some embodiments, the dummy gate DG and the portion of the fin structure 104 beneath the dummy gate DG are removed using hydrofluoric acid, sulfuric acid, ozone, any other suitable chemical or a combination thereof. In some embodiments, the dummy gate DG and the portion of the fin structure 104 beneath the dummy gate DG are removed by sequentially using hydrofluoric acid, sulfuric acid and ozone.

After the cavity C is formed, a dielectric layer 114 and a gate G are sequentially formed in the cavity C, as shown in FIGS. 2H and 1B. In some embodiments, the dielectric layer 114 is formed using sputtering, PVD, CVD, MOCVD, MBE, any other method known and used in the art for forming the dielectric layer 114 or a combination thereof. In some embodiments, the dielectric layer 114 includes a high-k dielectric material, such as $HfO_2$, $ZrO_2$, $Y_2O_3$, $La_2O_5$, $Gd_2O_5$, $TiO_2$, $Ta_2O_5$, HfSiO, HfSiON, HfErO, HfLaO, HfYO, HfGdO, HfAlO, HfZrO, HfTiO, HfTaO, SrTiO, any other suitable high-k dielectric material or a combination thereof. In some embodiments, the gate G is formed using sputtering, PVD, CVD, atomic layer deposition (ALD), any other suitable formation technique or a combination thereof. In some embodiments, the gate G includes Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable material or a combination thereof.

In other embodiments, as shown in FIGS. 2A and 2D, after the fin structure 104, the dummy gate DG and the first spacer 106 are formed, a doped region DR is formed through the fin structure 104. In some embodiments, forming the doped region DR through the fin structure 104 is conducted by performing a PLAD process and an annealing process, as shown in FIGS. 2B and 2C. In some embodiments, the doped region DR through the fin structure 104 is formed using any suitable process.

Given above, the FinFET of the present disclosure can exhibit high Ion-Ioff since the doped region is formed using the PLAD process and the annealing process or formed through the fin structure. Moreover, current crowding effect will not occur since the bottom surface of the recess for accommodating the bottom of the gate is lower than or the same height as the bottom surface of the second spacer.

According to some embodiments, a FinFET includes a fin structure, a gate and a source-drain region. The fin structure is over a substrate and has a recess of an upper surface of the fin structure and a doped region in the fin structure and adjacent to the recess. The gate protrudes from the recess and across over the fin structure. The source-drain region is in the fin structure and adjacent to the doped region.

According to some embodiments, a method of manufacturing a FinFET includes forming a fin structure over a substrate. A dummy gate is formed across over the fin structure. A doped region is formed in the fin structure using a plasma doping process and an annealing process. A source-drain region is formed in the doped region. The dummy gate and a portion of the fin structure beneath the dummy gate are removed to form a cavity. A gate is formed in the cavity.

According to some embodiments, a method of manufacturing a FinFET includes forming a fin structure over a substrate. A dummy gate is formed across over the fin structure. A doped region is formed through the fin structure. A source-drain region is formed in the doped region. The dummy gate and a portion of the fin structure beneath the dummy gate are removed to form a cavity. A gate is formed in the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a FinFET, comprising:
    forming a fin structure over a substrate;
    forming a dummy gate that crosses over the fin structure;
    forming a doped region in the fin structure using a plasma doping process and an annealing process;
    forming a source-drain region in the doped region;
    removing the dummy gate and a portion of the fin structure beneath the dummy gate to form a cavity; and
    forming a gate in the cavity.

2. The method of claim 1, further comprising forming a first spacer over sidewalls of the dummy gate after forming the dummy gate.

3. The method of claim 2, further comprising forming a second spacer adjacent to the first spacer and over the doped region after forming the doped region.

4. The method of claim 1, wherein forming the doped region in the fin structure using the plasma doping process and the annealing process comprises:
    performing the plasma doping process to form a dopant-rich layer in the fin structure;
    annealing the dopant-rich layer to form the doped region in the fin structure; and
    removing the dopant-rich layer.

5. The method of claim 1, further comprising forming a CESL over the source-drain region after forming the source-drain region.

6. The method of claim 5, further comprising forming an ILD layer over the CESL after forming the CESL.

7. The method of claim 1, further comprising forming a dielectric layer in the cavity before forming the gate in the cavity.

8. The method of claim 3, wherein the second spacer has a bottom surface lower than a bottom surface of the first spacer.

9. The method of claim 4, wherein annealing the dopant-rich layer is performed with an oxygen-containing chemical.

10. The method of claim 4, wherein removing the dopant-rich layer comprises forming a recess over the doped region.

11. The method of claim 10, further comprising:
    forming a first spacer over sidewalls of the dummy gate after forming the dummy gate; and
    forming a second spacer adjacent to the first spacer and protruding from the recess after forming the recess over the doped region.

12. A method of manufacturing a FinFET, comprising:
    forming a fin structure over a substrate;
    forming a dummy gate that crosses over the fin structure;
    forming a doped region through the fin structure;

forming a source-drain region in the doped region;
removing the dummy gate and a portion of the fin structure beneath the dummy gate to form a cavity; and
forming a gate in the cavity.

13. The method of claim 12, wherein forming the doped region through the fin structure is conducted by performing a plasma doping process and an annealing process.

14. The method of claim 12, wherein forming the doped region through the fin structure comprises:
performing a plasma doping process to form a dopant-rich layer in the fin structure;
annealing the dopant-rich layer to form the doped region through the fin structure; and
removing the dopant-rich layer.

15. The method of claim 14, wherein annealing the dopant-rich layer is performed with an oxygen-containing chemical.

16. The method of claim 12, further comprising forming a first spacer over sidewalls of the dummy gate after forming the dummy gate.

17. The method of claim 16, further comprising forming a second spacer adjacent to the first spacer and over the doped region after forming the doped region.

18. The method of claim 12, further comprising forming a CESL over the source-drain region after forming the source-drain region.

19. The method of claim 18, further comprising forming an ILD layer over the CESL after forming the CESL.

20. The method of claim 12, further comprising forming a dielectric layer in the cavity before forming the gate in the cavity.

* * * * *